United States Patent
Cloots et al.

(10) Patent No.: US 6,444,400 B1
(45) Date of Patent: Sep. 3, 2002

(54) METHOD OF MAKING AN ELECTROCONDUCTIVE PATTERN ON A SUPPORT

(75) Inventors: Tom Cloots, Londerzeel; Frank Louwet, Diepenbeek; Ronn Andriessen, Beerse; Etienne Van Thillo, Essen, all of (BE)

(73) Assignee: Agfa-Gevaert, Mortsel (BE)

( * ) Notice: Subject to any disclaimer, the term of this patent is extended or adjusted under 35 U.S.C. 154(b) by 0 days.

(21) Appl. No.: 09/635,707

(22) Filed: Aug. 9, 2000

Related U.S. Application Data

(60) Provisional application No. 60/151,758, filed on Aug. 31, 1999.

(30) Foreign Application Priority Data

Aug. 23, 1999 (EP) .............................................. 99202705

(51) Int. Cl.⁷ ............................ H01B 1/12; H05K 3/00; B23K 26/00
(52) U.S. Cl. ....................... 430/311; 430/330; 430/944; 430/945
(58) Field of Search ................................ 430/311, 330, 430/944, 945

(56) References Cited

U.S. PATENT DOCUMENTS

| | | | |
|---|---|---|---|
| 4,540,620 A | * | 9/1985 | Johnson et al. ............. 428/195 |
| 5,561,030 A | | 10/1996 | Holdcroft et al. |
| 5,766,515 A | | 6/1998 | Jonas et al. |

FOREIGN PATENT DOCUMENTS

| | | |
|---|---|---|
| EP | 0 399 299 A2 | 11/1990 |
| EP | 0 399 299 A3 | 11/1990 |
| EP | 0 614 123 A1 | 9/1994 |
| EP | 0 615 256 A2 | 9/1994 |
| EP | 0 615 256 A3 | 9/1994 |
| JP | 58-012392 A * | 1/1983 |
| WO | WO 97/18944 | 5/1997 |

OTHER PUBLICATIONS

J. Bargon et al: "Laser Processing of Electronically Conducting Polymers Into Patterns", Microelectronic Engineering, NL, Elsevier Publishers BV., Amsterdam, vol. 20, No. 1/02, Mar. 1, 1993, pp. 55–72, XP000356096.

* cited by examiner

*Primary Examiner*—John A. McPherson
(74) *Attorney, Agent, or Firm*—Breiner & Breiner, L.L.C.

(57) ABSTRACT

A method of making an electroconductive pattern on a support is disclosed. The support is provided with a polymer layer containing a polythiophene, a polyanion and a di- or polyhydroxy organic compound. Said layer is characterized by an initial surface resistivity ($SR_i$) having a value which is higher than $10^4$ $\Omega/\square$, or more preferably higher than $10^6$ $\Omega/\square$. By heating selected areas of the polymer layer, the surface resistivity of these areas is reduced to $SR_i/\Delta$ wherein $\Delta$ is at least 10, preferably at least $10^3$ and more preferable at least $10^5$. The electroconductive pattern thus obtained can be used as an electronic circuit for making an electric or semiconductor device such as a printed circuit board, an integrated circuit, a display, an electroluminescent device or a photovoltaic cell.

10 Claims, No Drawings

METHOD OF MAKING AN ELECTROCONDUCTIVE PATTERN ON A SUPPORT

This application claims the benefit of U.S. Provisional Application No. 60/151,758 filed Aug. 31, 1999.

FIELD OF THE INVENTION

The present invention relates to a method for making a electroconductive pattern in an organic polymer layer which is suitable as an electronic circuitry in an electric or semiconductor device.

BACKGROUND OF THE INVENTION

Electric or semiconductor devices such as flat panel displays, photovoltaic cells or electrochromic windows typically contain a substrate provided with an indium tin oxide (ITO) layer as a transparent electrode. The coating of ITO is carried out by vacuum sputtering methods which involve high temperature conditions up to 250° C., and therefore, glass substrates are generally used. The high cost of the fabrication methods and the low flexibility (pliability) and stretchability of such electrodes, due to the brittleness of the inorganic ITO layer as well as the glass substrate, limit the range of potential applications. As a result, there is a growing interest in making all-organic devices, comprising plastic resins as a substrate and organic electroconductive polymer layers as an electrode. Such plastic electronics allow to obtain low cost devices with new properties (Physics World, March 1999, p.25–39). Flexible plastic substrates can be provided with an electroconductive polymer layer by continuous roller coating methods (compared to batch process such as sputtering) and the resulting organic electrodes enable the fabrication of electronic devices characterised by a higher flexibility and a lower weight.

The production and the use of electroconductive polymers such as polypyrrole, polyaniline, polyacetylene, polyparaphenylene, polythiophene, polyphenylenevinylene, polythienylenevinylene and polyphenylenesulfide are well known in the art. EP-A-440 957 describes a method for preparing polythiophene in an aqueous mixture by oxidative polymerisation in the presence of a polyanion as a doping agent. In EP-A-686 662 it has been disclosed that highly conductive layers of polythiophene, coated from an aqueous coating solution, could be made by the addition of a di- or polyhydroxy and/or a carbonic acid, amide or lactam group containing compound in the coating solution of the polythiophene layer and by keeping the coated layer at elevated temperature, preferably between 100 and 250° C., during preferably 1 to 90 seconds.

Coated layers of organic electroconductive polymers can be structured into patterns using the known wet-etching microlithography techniques. WO97/18944 describes a process wherein a positive or negative photoresist is applied on top of a coated layer of an organic electroconductive polymer, and after the steps of selectively exposing the photoresist to UV light, developing the photoresist, etching the electroconductive polymer layer and finally stripping the non-developed photoresist, a patterned layer is obtained. A similar technique has been described in Synthetic Metals, 22 (1988), p. 265–271 for the design of an all-organic thin-film transistor. Such methods are cumbersome as they involve many steps and require the use of hazardous chemicals. Research Disclosure No. 1473 (1998) describes photoablation as a method suitable for patterning organic electroconductive polymer layers, wherein the selected areas are removed from the substrate by laser irradiation. Such photoablation processes are convenient, dry, one-step methods but the generation of debris still requires a wet cleaning step and may contaminate the optics and mechanics of the laser structuring device. Some prior art methods also induce a difference of the optical density between electroconductive and non-conductive areas of the patterned surface, which should be avoided.

SUMMARY OF THE INVENTION

It is an object of the present invention to provide a convenient, dry, one-step method of patterning an electroconductive organic polymer layer which does not require a wet cleaning step and which does not influence the optical density of the polymer layer. This object is realized by the method of claim 1. Specific features for preferred embodiments of the invention are disclosed in the dependent claims.

Further advantages and embodiments of the present invention will become apparent from the following description.

DETAILED DESCRIPTION OF THE INVENTION

All values of surface resistivity (SR) presented in this document are measured according to the following method. The sample is cut to obtain a strip having a length of 27.5 cm and a width of 35 mm. Electrodes are applied over the width of the strip at a distance of 10 cm from each other. The electrodes are made of a conductive polymer, ECCOCOAT CC-2 available from Emerson & Cumming Speciality polymers. A constant potential is then applied over said electrodes and the current flowing through the circuit is measured on a Pico-amperemeter KEITHLEY 485. SR in $\Omega$/square ($\Omega/\square$) is calculated from the measured values of potential and current, taking into account the geometry of the measurement.

The polythiophene layer used in the method of the present invention is similar to those described in EP-A-686 662. However, contrary to the method of EP-A-686 662, the coated layer is not dried or treated at elevated temperature, so that the initial surface resistivity ($SR_i$) is kept at a high value of at least $10^4$ $\Omega/\square$, or more preferably at least $10^6$ $\Omega/\square$, i.e. the conductivity of the layer is insufficient to be suitable as an electrode. By heating selected areas (paths), hereinafter referred to as 'image-wise heating', the SR of said areas is decreased to $SR_i/\Delta$, wherein the factor $\Delta$ is at least 10, preferably at least $10^3$ or even more preferably at least $10^5$ so as to obtain a pattern of conductive and non-conductive areas which can be used as an electronic circuitry. Said electronic circuitry can be a relatively low-resolution circuitry as typically used in printed circuit boards or a high-resolution microcircuitry as used in integrated semiconductor devices. More applications of the present invention are indicated below.

Simulation experiments, wherein the above mentioned polymer layer is overall heated in an oven, indicate that a treatment at 200° C. during 2 minutes suffices to reduce $SR_i$ by a factor $\Delta$ between $10^4$ and $10^5$. The thickness of the layer is not significantly influenced by such treatment which illustrates that the organic polymer layer can be rendered electroconductive by heat treatment without invoking ablation. So the method of the present invention is particularly distinguished from prior art methods in that no material is removed from the layer, i.e. the conducting and non-conducting areas are all located in the same plane which may be beneficial when used in devices wherein very thin layers are applied on the electrodes, e.g. organic light emitting polymer displays. Moreover, the method of the present invention allows to obtain an electroconductive pattern showing no substantial difference of optical density between conducting and non-conducting areas. As an alternative method, contrary to the method of the present invention, one may also obtain an electroconductive pattern by ablating selected areas of the polymer layer and then overall heating the remaining areas, thereby decreasing the SR value so as to render said remaining areas electroconductive. However, said alternative method also involves ablation and thus is characterized by the same problems as the prior art methods described above.

The polythiophene used in the method of this invention has preferably the following formula:

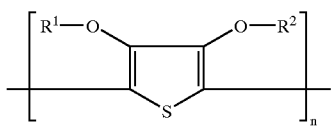

in which n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, preferably an ethylene group, an optionally alkyl-substituted methylene group, an optionally $C_{1-12}$ alkyl- or phenyl-substituted ethylene group, a 1,3-propylene group or a 1,2-cyclohexylene group.

The preparation of such a polythiophene and of aqueous dispersions containing such a polythiophene and a polyanion is described in EP-A-440 957 and corresponding U.S. Pat. No. 5,300,575. Basically the preparation of polythiophene proceeds in the presence of polymeric polyanion compounds by oxidative polymerisation of 3,4-dialkoxythiophenes or 3,4-alkylenedioxythiophenes according to the following formula:

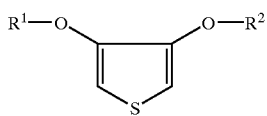

wherein $R^1$ and $R^2$ are as defined above.

Stable aqueous polythiophene dispersions having a solids content of 0.05 to 55% by weight and preferably of 0.1 to 10% by weight can be obtained by dissolving thiophenes corresponding to the formula above, a polyacid and an oxidizing agent in an organic solvent or preferably in water, optionally containing a certain amount of organic solvent, and then stirring the resulting solution or emulsion at 0 to 100° C. until the polymerization reaction is completed. The polythiophenes formed by the oxidative polymerization are positively charged, the location and number of such positive charges being not determinable with certainty and therefore not mentioned in the general formula of the repeating units of the polythiophene polymer.

The oxidizing agents are those which are typically used for the oxidative polymerization of pyrrole as described in for example J. Am. Soc. 85, 454 (1963). Preferred inexpensive and easy-to-handle oxidizing agents are iron(III) salts, e.g. $FeCl_3$, $Fe(ClO_4)_3$ and the iron(III) salts of organic acids and inorganic acids containing organic residues. Other suitable oxidizing agents are $H_2O_2$, $K_2Cr_2O_7$, alkali or ammonium persulfates, alkali perborates, potassium permanganate and copper salts such as copper tetrafluoroborate. Air or oxygen can also be used as oxiding agents. Theoretically, 2.25 equivalents of oxidising agent per mol of thiophene are required for the oxidative polymerization thereof (J. Polym. Sci. Part A, Polymer Chemistry, Vol. 26, p.1287, 1988). In practice, however, the oxidizing agent is used in excess, for example, in excess of 0.1 to 2 equivalents per mol of thiophene.

The polyacid forms a polyanion or, alternatively, the polyanion can be added as a salt of the corresponding polyacids, e.g. an alkali salt. Preferred polyacids or salts thereof are polymeric carbonic acids such as poly(acrylic acid), poly((meth)acrylic acid) and poly(maleic acid) or polymeric sulphonic acids such as poly(styrene sulphonic acid) or poly(vinyl sulphonic acid). Alternatively, copolymers of such carbonic and/or sulphonic acids and of other polymerizable monomers such as styrene or acrylates can be used. Poly(styrene sulphonic acid) is especially preferred. The molecular weight of these polyanion forming polyacids is preferably between 1000 and $2 \times 10^6$, more preferably between 2000 and $5 \times 10^5$. These polyacids or their alkali salts are commercially available and can be prepared according to the known methods, e.g. as described in Houben-Weyl, Methoden der Organische Chemie, Bd. E20 Makromolekulare Stoffe, Teil 2, (1987), pp. 1141.

The polythiophene dispersions obtained according to the above method can then be used as basic ingredient of a coating solution. The coating solution can also comprise additional ingredients, such as one or more binders, one or more surfactants, spacing particles, UV-filters or IR-absorbers. Suitable polymer binders are described in EP-A 564 911. Such binders may be treated with a hardening agent, e.g. an epoxysilane as described in EP-A 564 911, which is especially suitable when coating on a glass substrate.

The coating solution can be applied to the substrate by any means known in the art: it can be spin-coated, sprayed or coated by any of the continuous coating techniques that are used to coat solutions on running webs, e.g. dip coating, rod coating, blade coating, air knife coating, gravure coating, reverse roll coating, extrusion coating, slide coating and curtain coating. An overview of these coating techniques can be found in the book "Modern Coating and Drying Technology", Edward Cohen and Edgar B. Gutoff Editors, VCH publishers, Inc, New York, N.Y., 1992. It is also possible to coat simultaneously multiple layers by coatings technique such as slide coating and curtain coating. It is also possible to apply the coating solution to the substrate by printing techniques, e.g., ink-jet printing, gravure printing, flexo printing, or offset printing.

The coating solution is preferably applied to the substrate in such an amount that the coated polymer layer contains between 10 and 5000 mg of polythiophene per $m^2$, more preferably between 100 and 500 mg of polythiophene per $m^2$. The coated polymer layer is preferably dried at a temperature below 100° C., more preferably below 70° C. and even more preferably between 40° C. so that the SR of the polymer layer is at least $10^4$ $\Omega/\square$, or more preferably at least $10^6$ $\Omega/\square$.

The coated polymer layer further comprises a di- or polyhydroxy organic compound, which can be added to the coating solution. Preferred examples of such di- or polyhydroxy organic compounds are sugar or sugar derivatives such as arabinose, saccharose, glucose, fructose and lactose, or di- or polyalcohols such as sorbitol, xylitol, mannitol, mannose, galactose, sorbose, gluconic acid, ethylene glycol, di- or tri(ethylene glycol), 1,1,1-trimethylol-propane, 1,3-propanediol, 1,5-pentanediol, 1,2,3-propanetriol, 1,2,4-butanetriol, 1,2,6-hexanetriol, or aromatic di- or polyalcohols such as resorcinol. The amount of these compounds in the coated layer may be between 10 and 5000 mg/$m^2$, preferably between 50 and 1000 mg/$m^2$.

The substrate used in the method of the present invention can be inorganic or organic. Suitable polymeric films are made of e.g. a polyester such as poly(ethylene terephthalate), poly(ethylene naphthalate), polystyrene, polyethersulphone, polycarbonate, polyacrylate, polyamide, polyimides, cellulosetriacetate, polyolefines, polyvinylchloride, etc. As inorganic substrates can be used silicon, ceramics, oxides, glass, polymeric film reinforced glass, glass/plastic laminates, e.g. as described in WO 99/21707 and WO 99/21708. The latter is a laminate of a flexible, thin glass and a plastic support, which is a highly suitable substrate for use in the present invention since such a material provides both a good dimensional stability as well as some flexibility. The substrate is preferably provided with an adhesion improving layer, whereon the above described coating solution can be applied.

The step of image-wise heating the polymer layer is preferably carried out by means of a scanning device such as a laser or a line-wise heating device such as a thermal head. Also other devices can be used, e.g. a heated stamp. The energy applied to the polymer layer during image-wise heating should be sufficiently high to decrease the SR value of the polymer layer so as to obtain electroconductive areas, but should not exceed a treshold value above which ablation or chemical processes are capable of substantially destroying the polymer layer.

Typical lasers which can be used in the method of the present invention are e.g. a He/Ne or Ar laser. Preferably, a laser emitting near infrared light having a wavelength in the range from about 700 to about 1500 nm is used, e.g. a semiconductor laser diode, a Nd:YAG or a Nd:YLF laser. The required laser power depends on the pixel dwell time of the laser beam, which is dependent on the scan speed (e.g. between 0.1 and 20 m/s, preferably between 0.5 and 5 m/s) and the spot diameter of the laser beam (defined at $1/e^2$ of maximum intensity e.g. between 1 and 100 $\mu$m, preferably between 10 and 25 $\mu$m). More details of the specific exposure parameters are given while discussing the examples below.

In order to improve the light absorption, a compound which is capable of converting light into heat may be added to the polymer layer. Useful compounds are for example organic dyes, carbon black, graphite, metal carbides, borides, nitrides, carbonitrides, or oxides. The polythiophene itself absorbs infrared light, so it may be unnecessary to add dyes or pigments when an infrared light source is used. The addition of a dye or pigment capable of absorbing visible light should even be avoided when the method of the present invention is to be used for making a transparent electrode. Alternatively, the support may absorb the incident light, e.g. when exposing a plastic support such as poly(ethylene terephthalate), to an excimer laser.

A typical thermal head for use in the method of the present invention contains a plurality of adjacent, microscopic heat-resistor elements, which convert electrical energy via the Joule effect into heat. Such thermal printing heads may be used in contact or, more preferred, close proximity with the polymer layer so as to transfer efficiently the heat to the polymer layer. The operating temperature of common thermal printheads is in the range of 300 to 400° C. and the heating time per element may be less than 20 ms or even less than 1.0 ms, the pressure contact of the thermal printhead with the material being e.g. 200 to 500 g/cm$^2$ to ensure a good transfer of heat.

The electroconductive pattern obtained by the method of the present invention can be used as an electronic circuit for making an electric or semiconductor device such as a printed circuit board, an integrated circuit, a display, an electroluminescent device or a photovoltaic cell. Preferred examples of a display are passive-matrix liquid crystal displays (LCDs) as well as active-matrix LCDs such as thin-film-transistor (TFT) displays. Particular examples are twisted nematic (TN), supertwisted nematic (STN), double supertwisted nematic (DSTN), retardation film supertwisted nematic (RFSTN), ferroelectric (FLC), guest-host (GH), polymer-dispersed (PF), polymer network (PN) liquid crystal displays. Emissive flat panel display types which may benefit from the present invention are e.g. plasma displays (PDs), field emission displays (FEDs) and so-called organic light-emitting polymer displays (OLEDs).

In OLEDs electrons and holes are injected from a cathode and anode respectively into an electroluminescent material, e.g. an electroluminescent polymer such as poly(p-phenylenevinylene) (PPV) and its derivatives, and then recombine to an exciton which relaxes to the ground state by radiative decay. Such an OLED typically comprises the following layers:

a reflecting cathode, e.g. a low-work function metal layer such as evaporated Ca.

an electroluminescent layer, e.g. PPV; other suitable electroluminescent compounds are described in e.g. "Organische Leuchtdioden", Chemie in unserer Zeit, 31. Jahrg. 1997, No.2, p.76–86.

an hole-injection layer an transparent anode a transparent substrate

The hole-injection layer as well as the anode layer can be patterned layers obtained according to the method of the present invention.

The patterned electrode obtained by the method of the present invention can also be used for screening electromagnetic radiation or earthing electric charges, for making touch screens, radio frequency identification tags, electrochromic windows and in imaging systems, e.g. silver halide photography or electrophotography. Also a device such as the electronic book described in WO 97/04398 may particularly benefit from the flexible electrode of the present invention. Even more applications are described in WO 97/18944.

EXAMPLES

Preparation of a Polythiophene Dispersion (Hereinafter Referred to as "PT")

Into 3000 ml of an aqueous solution of 31.5 g of polystyrene sulphonic acid (171 mmol of $SO_3H$ groups) with number-average molecular weight (Mn) 40000, were introduced 25.7 g of sodium peroxodisulfate ($Na_2S_2O_8$), 0.225 g of $Fe_2(SO_4)_3.9H_2O$ and 12.78 g of 3,4-ethylenedioxy-thiophene. The thus obtained reaction mixture was stirred vigorously for 7 hours at 30° C. After adding again 4.3 g of sodium peroxodisulfate ($Na_2S_2O_8$) the mixture was vigorously stirred for 14 hours at 30° C. The reaction mixture was stirred twice for 2 hours at room temperature in the presence of a granulated weak basic ion exchange resin LEWATIT H 600 and strongly acidic ion exchanger LEWATIT S 100 (both trade names of Bayer AG, Leverkusen, Germany). The ion exchange resins were then filtered off and, finally, the mixture was postheated at 95° C. for 2 hours. The resulting dark blue dispersion had a solid content of 1.15% by weight.

Examples 1–3

Three coating solutions were prepared. 417 ml of the above dispersion PT was mixed with a binder (8.5 ml of a 300 g/l aqueous dispersion of a copolymer of 88% vinylidene-chloride, 10% methylacrylate and 2% itaconic acid) and a different amount of sorbitol for each sample, as indicated below. Then, a surfactant was added (0.5 ml of FLUORAD FC430, trade name of 3M) and finally distilled water to make 1 liter. The solutions thus obtained were each coated at a wet thickness of 40 $\mu$m on a 100 $\mu$m PET film, which was provided with an adhesion layer. After drying at 35° C., the initial surface resistivity $SR_i$ of these samples was higher than $10^6$ $\Omega/\square$. The three coated samples comprised 200 mg/m$^2$ of poly(3,4-ethylenedioxy-thiophene) doped with poly(styrene sulphonate) and 90, 360 or 900 mg/m$^2$ of sorbitol (Example 1, 2 and 3 respectively).

The samples were exposed to a Nd:YAG laser having a spot width $(1/e^2)$ of 22 µm. The power and scan speed of the laser beam were varied as indicated in Table 1 so as to expose different areas of the samples to different levels of heating. The SR value of the exposed areas ($SR_e$) was measured and the factor Δ was calculated ($\Delta=SR_i/SR_e$). It is clear from the results in Table 1 that Δ is dependent the intensity of incident light up to a maximum value of Δ between $10^4$ and $10^6$. At still a higher exposure intensity, Δ again decreases, probably due to photo-induced ablation or other degradation processes which may destroy the polymer layer.

TABLE 1a

Δ values of Examples 1–3 vs. laser power at a scan speed of 1 m/s

| Ex. no. | $SR_i$ (Ω/□) | Laser power (mW) | | | | | | | | |
|---|---|---|---|---|---|---|---|---|---|---|
| | | 50 | 100 | 150 | 200 | 250 | 300 | 350 | 400 | 450 |
| 1 | $5.2 \times 10^7$ | 1400 | 35000 | 1200 | 7 | 0.03 | 0.0047 | 0.0013 | 0.0005 | 0.0004 |
| 2 | $2.4 \times 10^8$ | 20 | 7000 | 80000 | 96000 | 20000 | 660 | | 0.10 | 0.11 | 0.12 |
| 3 | $7.3 \times 10^8$ | 9 | 43 | 92000 | 200000 | 20000 | 140000 | 14000 | 1 | 0.37 |

TABLE 1b

Δ values of Examples 1–3 vs. laser power at a scan speed of 4 m/s

| Ex. no. | $SR_i$ (Ω/□) | Laser power (mW) | | | | | | | | |
|---|---|---|---|---|---|---|---|---|---|---|
| | | 50 | 100 | 150 | 200 | 250 | 300 | 350 | 400 | 450 |
| 1 | $5.2 \times 10^7$ | 4 | 600 | 8000 | 26000 | 20000 | 1300 | 2 | 0.33 | 1.86 |
| 2 | $2.4 \times 10^8$ | 1 | 1 | 55 | 4500 | 63000 | 140000 | 170000 | 160000 | 150000 |
| 3 | $7.3 \times 10^8$ | 1 | 1 | 2 | 2 | 5 | 152 | 1200 | 400 | 36000 |

Examples 4–8

Five coating solutions were prepared. 417 ml of the above dispersion PT was mixed with a binder as indicated below and 20 ml of a 450 g/l aqueous solution of sorbitol. Then, a surfactant was added (10 ml of a 20 g/l aqueous solution of Zonyl FSN100, trade name of DuPont) and finally distilled water to make 1 liter. The solutions thus obtained were each coated at a wet thickness of 40 µm on a 100 µm PET film, which was provided with an adhesion layer. After drying at 35° C., the initial surface resistivity $SR_i$ of these samples was higher than $10^6$ Ω/□. The five samples each comprised 200 mg/m² of poly(3,4-ethylenedioxy-thiophene) doped with poly(styrene sulphonate). Examples 4, 5 and 6 further comprised respectively 100, 500 and 2000 mg/m² of the same binder as used in Examples 1–3. Examples 7 and 8 instead comprised respectively 200 and 500 mg/m² of poly(vinyl pyrrolidone) as a binder.

These samples were subjected to heating by a thermal head comprising heat-resistor elements of pixel size 80 µm×80 µm (about 300 pixels per inch). Each such element was 8-bit addressed and the data level 255 corresponded to a total heating time of 12 ms. The heat generated by the elements was varied as indicated in Table 2 so as to expose different areas to different energy levels of heating. The SR value of the heated areas was measured for each energy level applied and the factor Δ was calculated as explained above.

TABLE 2

Δ values of Examples 4–8 vs. thermal head energy

| Ex. no. | $SR_i$ (Ω/□) | Energy per pixel (mJ) | | | | |
|---|---|---|---|---|---|---|
| | | 0.35 | 0.53 | 0.70 | 0.88 | 1.05 |
| 4 | $1.1 \times 10^7$ | 1 | 1 | 1 | 30 | 130 |
| 5 | $9.4 \times 10^6$ | 1 | 0.5 | 2 | 100 | 250 |
| 6 | $1.1 \times 10^7$ | 1 | 5 | 35 | 300 | 1100 |

TABLE 2-continued

Δ values of Examples 4–8 vs. thermal head energy

| Ex. no. | $SR_i$ (Ω/□) | Energy per pixel (mJ) | | | | |
|---|---|---|---|---|---|---|
| | | 0.35 | 0.53 | 0.70 | 0.88 | 1.05 |
| 7 | $1.0 \times 10^7$ | 1 | 1 | 0.7 | 2 | 120 |
| 8 | $1.0 \times 10^7$ | 1 | 1 | 1 | 0.7 | 50 |

None of the above Examples (1–8) showed a significant difference between the optical density of heated and non-heated areas.

What is claimed is:

1. A method of making an electroconductive pattern on a support which is provided with a polymer layer containing a polythiophene, a polyanion and a di- or polyhydroxy organic compound, wherein the surface resistivity (SR) of the polymer layer is reduced at selected areas from an initial value $SR_i$, which is higher than $10^4$ Ω/□, to $SR_i/\Delta$, Δ being at least 10, by heating said selected areas without substantially ablating or destroying the polymer layer and without substantial difference of optical density between electroconducting and non-electroconducting areas.

2. A method according to claim 1 wherein $SR_i$ is higher than $10^6$ Ω/□.

3. A method according to claim 1 wherein Δ is at least $10^3$.

4. A method according to claim 1 wherein Δ is at least $10^5$.

5. A method according to claim 1 wherein the polythiophene corresponds to formula (I):

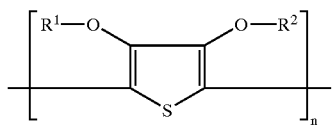

(I)

in which n is larger than 1 and each of $R^1$ and $R^2$ independently represents hydrogen or an optionally substituted $C_{1-4}$ alkyl group or together represent an optionally substituted $C_{1-4}$ alkylene group or an optionally substituted cycloalkylene group, an optionally alkyl-substituted methylene group, an optionally $C_{1-12}$ alkyl- or phenyl-substituted ethylene group, a 1,3-propylene group or a 1,2-cyclohexylene group.

6. A method according to claim 5 wherein $R^1$ and $R^2$ in the polythiophene according to formula (I) together represent an ethylene group.

7. A method according to claim 1 wherein the polyanion is a poly(styrene sulphonate).

8. A method according to claim 1 wherein the support is a transparent plastic support.

9. A method according to claim 1 wherein the selected areas are heated by a thermal head or a laser.

10. A method according to claim 9 wherein the laser is an infrared laser.

* * * * *